United States Patent
Colombo et al.

(10) Patent No.: US 6,852,645 B2
(45) Date of Patent: Feb. 8, 2005

(54) HIGH TEMPERATURE INTERFACE LAYER GROWTH FOR HIGH-K GATE DIELECTRIC

(75) Inventors: Luigi Colombo, Dallas, TX (US); James J. Chambers, Dallas, TX (US); Antonio L. P. Rotondaro, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/367,429

(22) Filed: Feb. 13, 2003

(65) Prior Publication Data

US 2004/0161883 A1 Aug. 19, 2004

(51) Int. Cl.[7] .............................................. H01L 21/469
(52) U.S. Cl. ...................... 438/770; 438/287; 438/594
(58) Field of Search ................................ 438/770, 287, 438/594, 787

(56) References Cited

U.S. PATENT DOCUMENTS

| | | | | |
|---|---|---|---|---|
| 5,009,926 A | * | 4/1991 | Fukuda | 427/557 |
| 5,124,272 A | * | 6/1992 | Saito et al. | 438/297 |
| 6,214,736 B1 | | 4/2001 | Rotondaro et al. | |
| 6,492,283 B2 | * | 12/2002 | Raaijmakers et al. | 438/770 |
| 2003/0049942 A1 | * | 3/2003 | Haukka et al. | 438/778 |

* cited by examiner

Primary Examiner—David Nelms
Assistant Examiner—Quoc Hoang
(74) Attorney, Agent, or Firm—Rose Alyssa Keagy; W. James Brady, III; Frederick J. Telecky, Jr.

(57) ABSTRACT

The present invention pertains to methods for forming high quality thin interface oxide layers suitable for use with high-k gate dielectrics in the manufacture of semiconductor devices. An ambient that contains oxygen and a reducing agent is utilized to grow the layers. The oxygen facilitates growth of the layers, while the reducing agent simultaneously counteracts that growth. The rate of growth of the layers can thus be controlled by regulating the partial pressure of the reducing agent, which is the fraction of the reducing agent in the gas phase times the total pressure. Controlling and slowing the growth rate of the layers facilitates production of the layers to thicknesses of about 10 Angstroms or less at temperatures of about 850 degrees Celsius or more. Growing the layers at high temperatures facilitates better bonding and production of higher quality layers, which in turn yields better performing and more reliable resulting products.

28 Claims, 6 Drawing Sheets

US 6,852,645 B2

HIGH TEMPERATURE INTERFACE LAYER GROWTH FOR HIGH-K GATE DIELECTRIC

FIELD OF INVENTION

The present invention relates generally to semiconductor processing, and more particularly to a methodology for establishing high quality, very thin interface layers suitable for use with high-k gate dielectrics in the manufacture of semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a metal or polysilicon gate contact is energized to create an electric field in a channel region of a semiconductor body, by which current is allowed to conduct between a source region and a drain region of the semiconductor body. The source and drain regions are typically formed by adding dopants to targeted regions on either side of the channel region in a semiconductor substrate. A gate dielectric, such as silicon dioxide ($SiO_2$), is formed over the channel region, and a gate contact (e.g., metal or doped polysilicon) is formed over the gate dielectric, where the gate dielectric and gate contact materials are patterned to form a gate structure overlying the channel region of the substrate.

The gate dielectric is an insulator material, which prevents large currents from flowing from the gate into the channel when a voltage is applied to the gate contact, while allowing such an applied gate voltage to set up an electric field in the channel region in a controllable manner. A continuing trend in the manufacture of semiconductor products is toward a steady reduction in electrical device feature size (scaling), together with improvement in device performance in terms of device switching speed, power consumption and reliability. New materials and processes have been developed and employed in silicon process technology to accommodate device scaling, including the ability to pattern and etch smaller device features. Recently, however, electrical and physical limitations have been reached in the thickness of gate dielectrics formed of $SiO_2$.

By way of example, FIG. 1A illustrates a conventional CMOS device 2 with PMOS and NMOS transistor devices 4 and 6, respectively, formed in or on a silicon substrate 8. Isolation structures 10 are formed to separate and provide electrical isolation of the individual devices 4 and 6 from other devices and from one another. The substrate 8 is lightly doped p-type silicon with an n-well 12 formed therein under the PMOS transistor 4. The PMOS device 4 includes two laterally spaced p-doped source/drain regions 14a and 14b with a channel region 16 located therebetween in the n-well 12. A gate is formed over the channel region 16 comprising an $SiO_2$ gate dielectric 20 overlying the channel 16 and a conductive polysilicon gate contact structure 22 formed over the gate dielectric 20. The NMOS device 6 includes two laterally spaced n-doped source/drain regions 24a and 24b outlying a channel region 26 in the substrate 8 (or alternatively a p-well region (not shown)) with a gate formed over the channel region 26 comprising an $SiO_2$ gate dielectric layer 30 and a polysilicon gate contact 32, where the gate dielectrics 20 and 30 may be patterned from the same oxide layer.

Referring to the NMOS device 6, the resistivity of the channel 26 may be controlled by the voltage applied to the gate contact 32, by which changing the gate voltage changes the amount of current through channel 26. The gate contact 32 and the channel 26 are separated by the $SiO_2$ gate dielectric 30, which is an insulator. Thus, little or no current flows between the gate contact 32 and the channel 26, although "tunneling" current is observed with thin dielectrics. However, the gate dielectric 30 allows the gate voltage at the contact 32 to induce an electric field in the channel 26, by which the channel resistance can be controlled by the applied gate voltage.

MOSFET devices produce an output current proportional to the ratio of the width over the length of the channel, where the channel length is the physical distance between the source/drain regions (e.g., between regions 24a and 24b in the device 6) and the width runs perpendicular to the length (e.g., perpendicular to the page in FIG. 1A). Thus, scaling the NMOS device 6 to make the width narrower may reduce the device output current. Previously, this characteristic has been accommodated by decreasing the thickness of gate dielectric 30, thus bringing the gate contact 32 closer to the channel 26 for the device 6 of FIG. 1A. Making the gate dielectric layer 30 thinner, however, has other effects, which may lead to performance tradeoffs, particularly where the gate dielectric 30 is $SiO_2$.

One shortcoming of a thin $SiO_2$ gate dielectric 30 is large gate tunneling leakage currents due to direct tunneling through the oxide 30. This problem is exacerbated by conventional limitations in the ability to deposit or grow such thin films with uniform thickness. Also, a thin $SiO_2$ gate dielectric layer 30 provides a poor diffusion barrier to dopants, for example, causing high boron dopant penetration into the underlying channel region 26 during fabrication of the source/drain regions 24a and 24b.

Consequently, recent efforts involving MOSFET device scaling have focused on alternative dielectric materials which can be formed in a thicker layer than scaled silicon dioxide layers and yet still produce the same field effect performance. These materials are often referred to as high-k materials because their dielectric constants are greater than that of $SiO_2$. The relative performance of such high-k materials is often expressed as equivalent oxide thickness (EOT), because the alternative material layer may be thicker, while still providing the equivalent electrical effect of a much thinner layer of $SiO_2$.

In one approach, such high-k dielectrics are typically deposited directly over a silicon substrate to form a gate dielectric layer of about 50 Angstroms. The performance and reliability of the resulting transistors, however, is dependent upon the quality of the interface between the high-k dielectric material and the underlying silicon.

Referring to FIG. 1B, one proposed alternative structure is illustrated, in which a high-k gate dielectric material 30a is used to form a gate dielectric layer 30' in an NMOS device 6'. A conductive polysilicon gate contact structure 32' is then formed over the high-k dielectric layer 30a. However, the alternative gate dielectric materials explored thus far typically include oxygen components, and are often deposited using deposition techniques, such as chemical vapor deposition (CVD), atomic layer deposition (ALD), or physical vapor deposition (PVD) processes, that use oxidizing reactants.

Thus, in forming the high-k dielectric layer 30a, the upper surface of the silicon substrate 8 oxidizes, forming an unintended low quality, low-k oxide layer 30b between the substrate 8 and the high-k material 30a. The presence of this interfacial oxide layer 30b increases the effective oxide thickness, reducing the effectiveness of the alternative gate dielectric approach. In addition, the interface 30b generally has unsatisfied bonds that act as interface charging centers, causing interface states. The high density of such interface states in the low quality oxide 30b results in carrier mobility degradation in operation of the transistor 6', where the higher the density of the interface states, the more the resulting mobility degradation. Additionally, lower quality oxides may also suffer from issues related to, among other things, charge scattering, charge trapping, fixed charge, density of interface state ($D_{it}$), carrier mobility, etc. For example, low charge scattering may be related to a high mobility type of oxide. Carriers in a channel created with a gate oxide of low charge scattering may have high mobility, for example.

Other approaches involve forming an oxide by a non-thermal means (e.g., UV-ozone oxide, $UV-O_3$, or chemical oxides) prior to depositing the high-k material 30a, to try to mitigate the mobility degradation problem. Such non-thermal oxides are typically grown at low temperatures. While these non-thermal oxides are generally better than unintended thermal oxides formed during high-k growth (e.g., layer 30b in FIG. 1B), there is a need for better mobility than that which can be achieved with non-thermal oxides. Growing oxides at higher temperatures produces higher quality oxides, but the oxide growth rate is difficult to control as the oxidation occurs rapidly at higher temperatures. Difficulty in controlling oxide growth rates can lead to non-uniform oxides, to oxides that are too thick, or to other undesirable results. Therefore, there is a need for improved gate fabrication techniques by which high quality interfaces can be achieved between the underlying silicon and deposited high-k dielectrics.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to methods for forming a high quality thin interface oxide layer suitable for use with high-k gate dielectrics in the manufacture of semiconductor devices. The layer can be grown to thicknesses of about 10 Angstroms or less at temperatures of about 850 degrees Celsius or more. The rate of growth of the interface oxide layer is controllable to allow the layer to be grown at higher temperatures, which in turn facilitates production of a higher quality layer. The growth rate is controlled by governing the partial pressure of a reducing agent that simultaneously counteracts the oxidation or growth of the layer. The partial pressure is the fraction of an agent times the total pressure.

According to one aspect of the present invention, a method of fabricating a transistor gate structure in a semiconductor device is provided. The method includes growing an interface oxide layer to a thickness of about 10 Angstroms or less over a semiconductor body. The layer is grown using an ambient comprising oxygen and a reducing agent. The presence of oxidizer and a reducer in an appropriate mixture leads to a concurrent oxidation and reduction of the oxide such that the oxide is grown at a rate of between about 20 to 55 Angstroms per minute at a temperature of about 850 degrees Celsius or more. The method also includes forming a high-k dielectric layer over the interface oxide layer, forming a gate contact layer over the high-k dielectric layer and then patterning the gate contact layer, the high-k dielectric layer, and the interface oxide layer to form a transistor gate structure.

According to another aspect of the present invention, a transistor gate structure suitable for implementation in a semiconductor device is provided. The structure includes an interface oxide layer formed over a semiconductor body; a high-k dielectric layer formed over the interface oxide layer and a gate contact layer formed over the high-k dielectric layer. The gate contact layer, the high-k dielectric layer, and the interface oxide layer are patterned to form the transistor gate structure. An oxidant comprising an oxygen containing molecule and a reducing agent is utilized to grow the interface oxide layer to a thickness of about 10 Angstroms or less. The oxidant presence of oxidizer and reducer in an appropriate mixture leads to a rate of between about 20 to 55 Angstroms per minute at a temperature of about 850 degrees Celsius or more.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
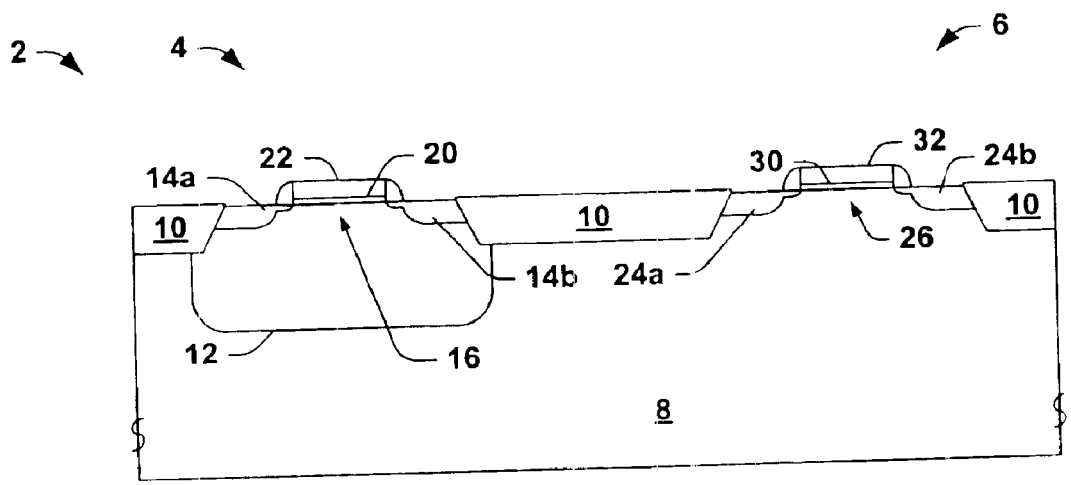
FIG. 1A is a partial side elevation view in section illustrating a conventional semiconductor device with NMOS and PMOS transistors.
Figure 1B:
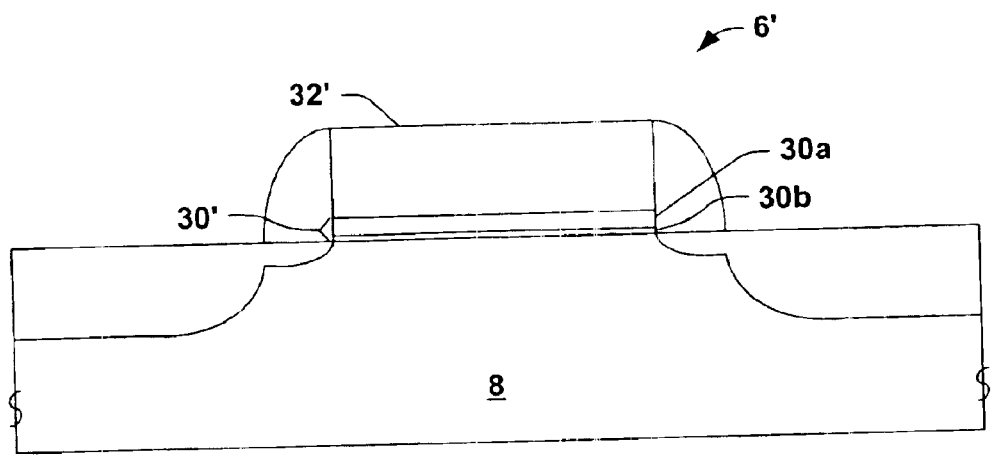
FIG. 1B is a partial side elevation view in section illustrating an unintended low quality interfacial layer in a proposed gate structure.

One or more implementations of the present invention will now be described with reference to the attached drawings, wherein like reference numerals are used to refer to like elements throughout. The invention relates to formation of ultra thin interface oxides suitable for implementation in gate structures in semiconductor devices, and more particularly to growing the interface oxides at high temperatures while controlling the rate of growth of the oxides (which traditionally speeds up growth rates).

The present invention pertains to methods for forming high quality thin interface oxide layers suitable for use with high-k gate dielectrics in the manufacture of semiconductor devices. The layers can be grown to thicknesses of about 10 Angstroms or less at relatively high temperatures of about 850 degrees Celsius or more. The rate of growth of the layers is controllable to allow the layers to be grown at higher temperatures, which facilitates production of higher quality layers. The higher quality layers facilitate production of better performing and more reliable resulting devices. The growth rate is controlled by governing the partial pressure of a reducing agent that concurrently counteracts the oxidation or growth of the layers, where the layers are grown by exposure to oxygen contained within an oxidant that also includes the reducing agent.

Figure 2:
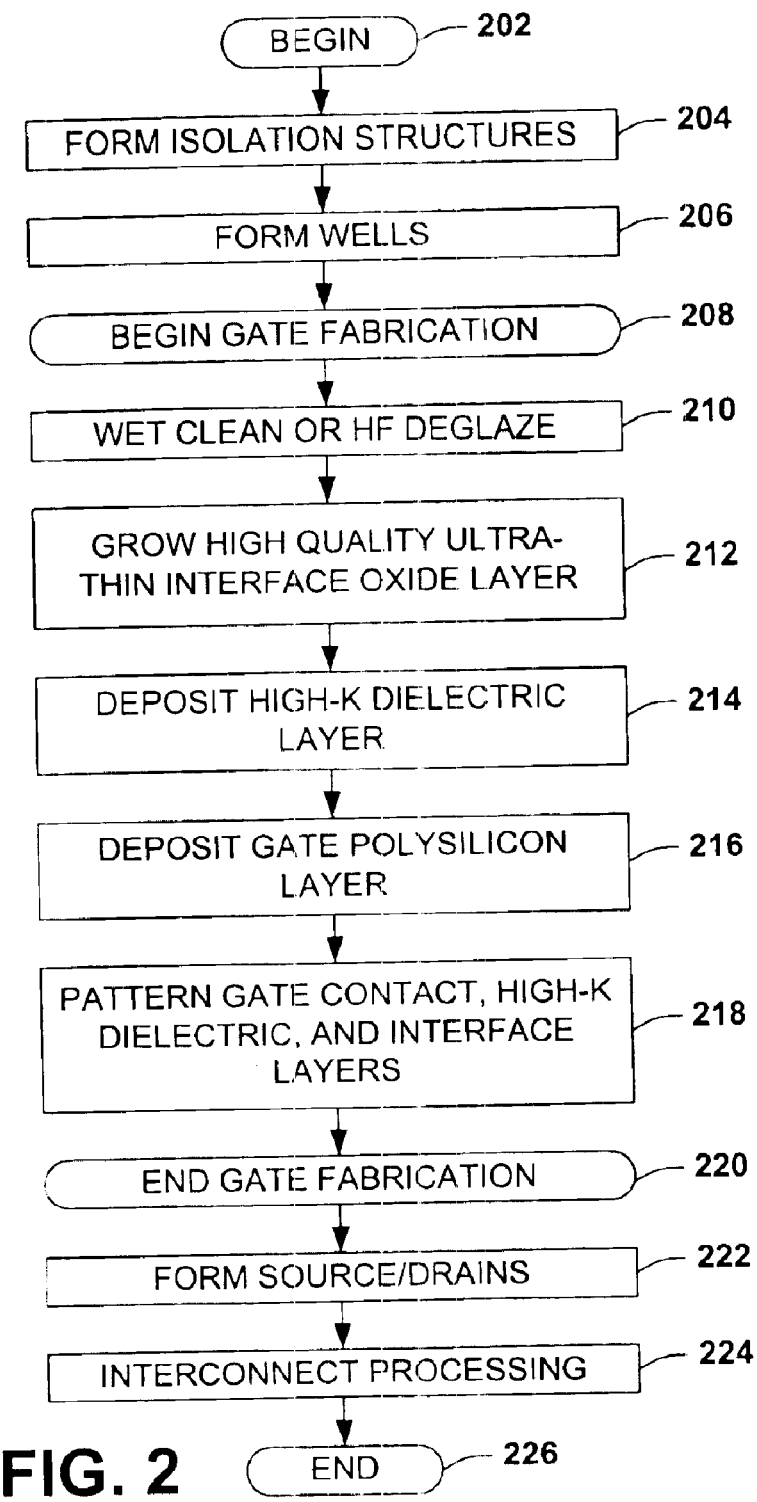
FIG. 2 is a flow diagram illustrating an exemplary method in accordance with the present invention.

Referring initially to FIG. 2, a flow diagram illustrates an exemplary method 200 for processing semiconductor devices, including fabrication of transistor gate structures in accordance with the present invention. Although the method 200 is illustrated and described herein as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. In addition, the methods according to the present invention may be implemented in association with the formation and/or processing of structures illustrated and described herein as well as in association with other structures not illustrated.

Beginning at 202, the method 200 comprises forming isolation structures at 204, such as STI or LOCOS oxide isolation structures in a semiconductor body. At 206, one or more wells (e.g., n-wells and/or p-wells) may be selectively formed in the semiconductor body, according to known implantation and/or diffusion techniques. At 208, gate fabrication begins, where a wet clean or a HF deglaze may be optionally performed at 210 to clean a top surface of the semiconductor body before growing the high quality interface oxide layer. The precleaning at 210 may be employed for removal of any thin dielectric layers from the silicon body, such as silicon oxide (SiO), silicon nitride (SiN), or silicon oxynitride (SiON). For removing SiO, wet cleaning operations can be performed at 210, or a dilute HF solution may be employed to deglaze the semiconductor body. One example of such an HF deglaze involves dipping the semiconductor in a 1:100 volume dilution of 49% HF at room temperature for a duration that is adequate to completely remove and SiO from the surface. In another example, a dry process is employed comprising a mixture of anhydrous HF and isopropyl-alcohol to remove SiO.

At 212, a high quality ultra-thin (e.g., 10 Angstroms or less) interface oxide layer is grown over the semiconductor body using an oxidant comprising oxygen and a reducing agent. The semiconductor body generally comprises silicon, and the oxygen reacts with the silicon to form the oxide interface layer (e.g., silicon dioxide ($SiO_2$)). The reducing agent simultaneously etches the oxide interface layer as the layer is grown (e.g., via the presence of the oxygen in the ambient oxidant). The concurrent oxidation and reduction of the oxide interface layer slows the resulting effective growth rate of the layer allowing it to be grown in a controllable manner (e.g., to achieve a desired thickness and/or level of uniformity). The concurrent oxidation and reduction also permits the layer to be formed under higher temperatures (e.g., about 850 degrees Celsius or more). Growing the oxide interface layer at higher temperatures yields higher quality oxides, that in turn facilitates production of better and more reliable resulting products.

While not wishing to be tied to any particular theory, at higher temperatures atoms (e.g., of oxygen) have more energy and move around more easily, and can thus react more readily to find stable positions in forming the oxide layer. Consequently, the higher quality oxide possesses fewer dangling bonds at the interface (e.g., that are not fulfilled by oxygen). At lower temperatures (e.g., conventionally below about 850 degrees Celsius) more defects are created because there is less atomic mobility resulting in more "frozen-in" defects.

Figure 3:
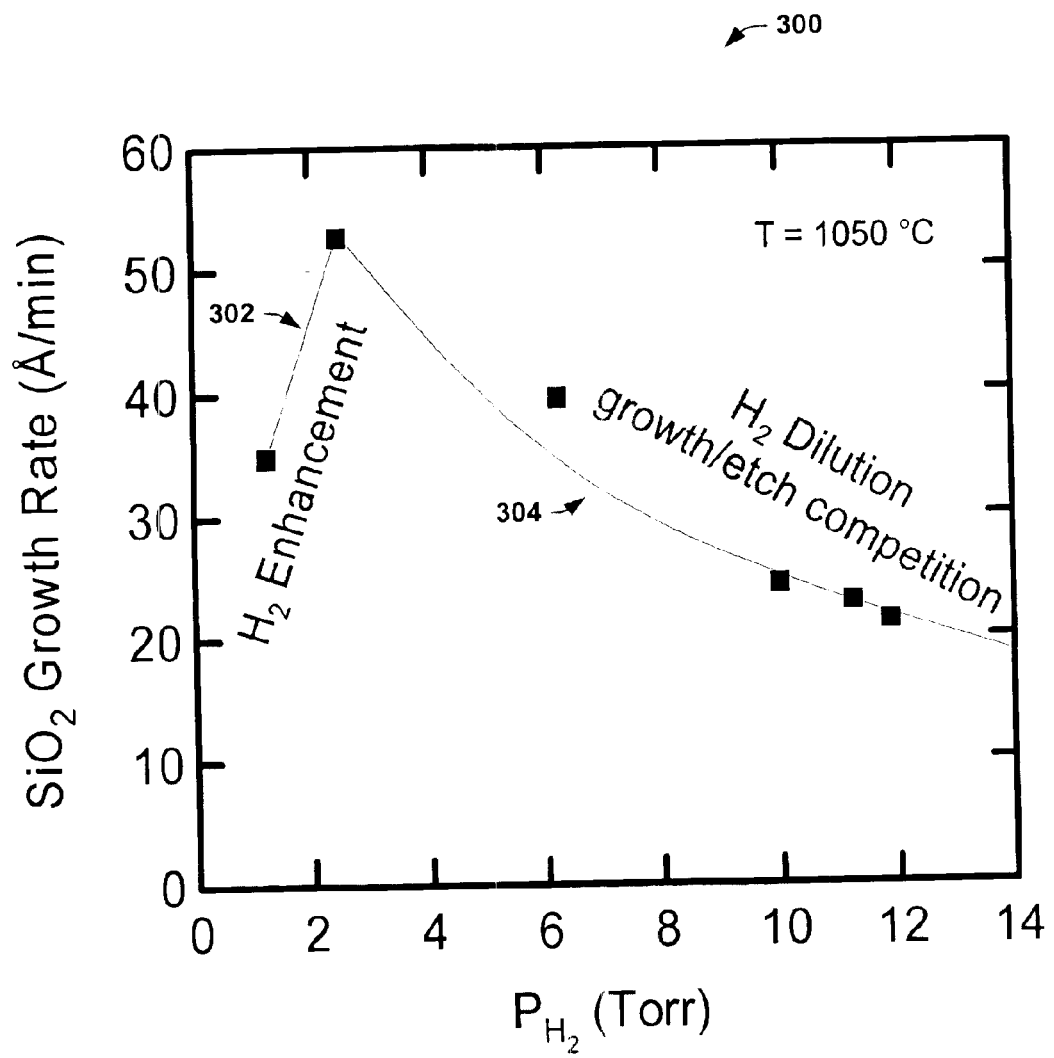
FIG. 3 is a graph charting an interface oxide layer growth rate as a function of the partial pressure of a reducing agent in a gas phase.

Turning briefly to FIG. 3, a curve 300 of the growth rate (y-axis) of the oxide interface layer versus a partial pressure of the reducing agent in the gas phase (x-axis) is depicted. The partial pressure is the fraction of a reducing agent in the gas phase times the total pressure (e.g., in a processing chamber wherein the gases are contained). In the example illustrated, the reducing agent is hydrogen, and a balance of nitrous oxide ($N_2O$) is also present. It will be appreciated that while hydrogen is depicted as the reducing agent, for purposes of the present invention, the reducing agent can comprise any suitable number of elements, either alone or in combination, such as hydrochloric acid (HCl), for example, that counteract the oxidation to reduce the rate of oxide growth. It will also be appreciated that while nitrous oxide may be utilized as the oxidizing agent, for purposes of the present invention, the oxidizing agent can comprise any suitable number of elements or molecules, either alone or in combination, such oxygen or nitric oxide for example, that can oxidize silicon.

It can be seen along the curve at 302 that where the partial pressure of hydrogen is below about 2 Torr (e.g., between about 1 and a little over 2 Torr), the growth rate of the oxide interface layer increases rapidly from about 35 to about 55 Angstroms/minute. Along this portion of the curve 302, hydrogen reacts with the oxygen to form water vapor ($H_2O$), which increases the oxidation rate. This "wet" oxidation may, for example, be where the hydrogen is below about 6 Torr. As the partial pressure of hydrogen begins to exceed about 6 Torr, the hydrogen combines with the oxygen to a lesser and lesser extent, and the excess hydrogen acts as an etchant to slow the rate of growth of the oxide interface layer. This is depicted along the curve at 304, which indicates that as the partial pressure of hydrogen increases, and consequently the amount of excess hydrogen increases, the growth rate of the oxide layer becomes further and further reduced.

In the example illustrated, the layer of silicon dioxide ($SiO_2$) is generated under a total pressure of about 12.5 Torr at a temperature of about 1050 degrees Celsius. It will be appreciated, however, that these parameters may be varied to achieve different results. For example, the $SiO_2$ oxide interface layer can be grown under a pressure of between about 1 mtorr to 100 Torr to alter the growth rate where low pressure (even <1 mtorr) is advantageous to retard the growth rate.

Therefore, when hydrogen is used as a reducing agent unexpected results occur. Typically, hydrogen is use to enhance oxidation, resulting in a faster oxide growth rate. However, the inventors of the present invention discovered that by increasing the partial pressure of hydrogen the oxide growth rate can be reduced at high temperatures. Consequently, the present invention provides for the advantages of high temperatures (e.g., high quality oxide growth) while limiting the growth rate. With a slow growth rate, a high quality oxide can be formed and used in numerous applications, for example, as an interface oxide in a high-k dielectric transistor. High quality oxides can be defined as those oxides with an interfacial trap density ($D_{it}$) of <=5E10 $cm^{-2}$.

Referring back to FIG. 2, after the interface oxide layer has been grown at 212, the method proceeds to 214 where a high-k dielectric layer is formed over the interface oxide layer. The interface oxide layer formed at 212 may operate as a high quality nucleation layer for the high-k deposition at 214. The high-k dielectric material can be applied in any suitable manner, such as with spin-on techniques, sputtering techniques (e.g., magnetron or ion beam sputtering), growth and/or deposition techniques, such as chemical vapor deposition (CVD) or atomic layer deposition (ALD), for example. The high-k dielectric material can be formed to a thickness of about 1 nanometers or more, and can have an equivalent oxide thickness (EOT) of about 1 nanometers or less, for example. The high-k dielectric material generally comprises a material having a dielectric constant higher than about 3.9 (e.g., higher than silicon dioxide ($SiO_2$)).

Examples of high-k dielectric materials include, but are not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalite and bismuth titanate. It will be appreciated that the high-k dielectric may be annealed after deposition to heal bulk defects and/or complete its stoichiometry.

A conductive metal or polycrystalline silicon (polysilicon) gate contact layer is then formed over the high-k dielectric layer at 216 (e.g., via sputtering, deposition, growth techniques, etc.). The gate electrode layer generally includes polysilicon, and can be formed to a thickness of about 100 nanometers, for example. The gate electrode layer ultimately yields a contact that provides a structure for applying a voltage to the transistor or otherwise biasing the transistor.

The gate contact layer, the high-k dielectric layer, and the interface oxide layer are then patterned to form a gate structure at 218. The transistor gate structure thus comprises a gate electrode, a high-k gate dielectric and a thin interface oxide layer. The layers can be patterned in any suitable manner to form the gate structure, such as by etching, for example. The gate fabrication then ends at 220. At 222, source/drain regions of the semiconductor body are provided with appropriate n or p type dopants through implantation or diffusion, and interconnect processing is performed at 224 according to known interconnect techniques, before the method 200 ends at 226. In an alternate approach, the polysilicon gate contact layer may be initially patterned without patterning the gate dielectric and interface layers, where the source/drain regions are implanted through the gate dielectric and interface layers, and the high-k dielectric and interface oxide layers are patterned later.

Referring now to FIGS. 4–9, processing of an exemplary semiconductor device 400 is illustrated at various stages of manufacturing in accordance with various aspects of the invention to fabricate transistor gate structures therein. The device 400 comprises a wafer having a semiconductor body 402 therein, such as a silicon substrate or other semiconductor substrate, or a layer of silicon or other semiconductor deposited over an insulator in an SOI device wafer. In the illustrated example, the semiconductor body 402 is a lightly doped p-type silicon substrate. It is to be appreciated that the term "semiconductor body" as used herein can include a base semiconductor wafer and any epitaxial layers or other type semiconductor layers formed there over or associated therewith. It is to be further appreciated that elements depicted herein and in the accompanying Figures are illustrated with particular dimensions relative to one another (e.g., layer to layer dimensions and/or orientations) for purposes of simplicity and ease of understanding, and that the actual dimensions of the elements may differ substantially from that as shown and described herein.

Figure 4:
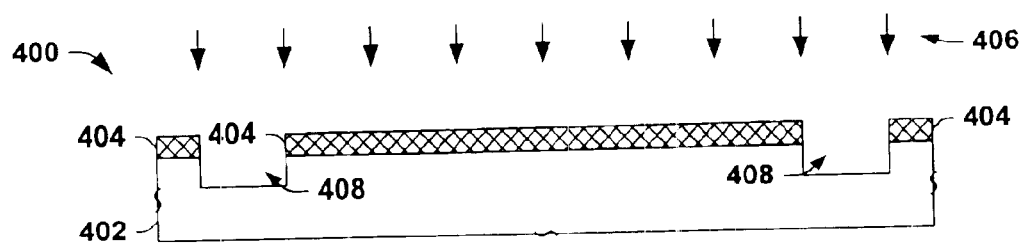
FIGS. 4–9 are partial side elevation views in section illustrating an exemplary semiconductor device being processed at various stages of manufacturing in accordance with various aspects of the invention.
Figure 5:
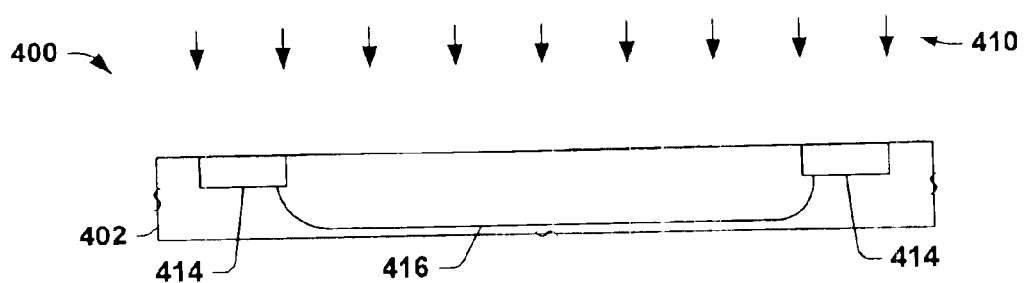

In FIGS. 4 and 5, isolation structures (e.g., $SiO_2$ field oxide (FOX) or shallow trench isolation (STI) structures) are initially formed in the body 402 to separate and provide electrical isolation between active areas in the body 402. An isolation mask 404 is formed over the device 400 in FIG. 4 and a trench etch process 406 is performed to form isolation trenches 408 in isolation regions of the semiconductor body 402. The trenches 408 are then filled in FIG. 5 with dielectric material via a deposition process 410 and the device 400 is planarized via a CMP process (not shown) to leave STI type dielectric isolation structures 414, for example, $SiO_2$. One or more p and/or n-type wells are then formed in the semiconductor body 402, including an n-well 416, as illustrated in FIG. 5, and an optional wet clean or HF deglaze operation (not shown) may be performed to clean the top surface of the semiconductor body 402.

Figure 6:
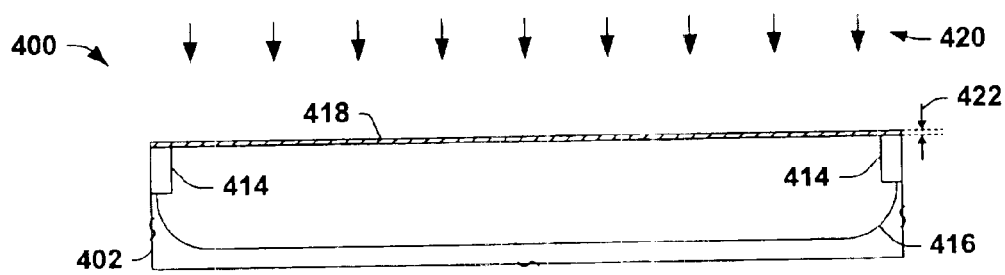

In FIG. 6, gate fabrication processing begins with the growth of an ultra-thin high quality interface oxide layer 418 over the semiconductor body 402 via a high temperature oxidation process 420. The oxide interface layer 418 is grown to a thickness 422 of about 10 Angstroms or less, and generally comprises silicon (e.g., $SiO_2$). The duration of the oxidation process 420 can vary depending upon the equipment and/or tooling utilized. The rate of growth of the interface oxide layer 418 is controlled by regulating the partial pressure of a reducing agent to which the body 402 is exposed. The partial pressure is the fraction of an agent relative to the total pressure (e.g., in a processing chamber containing these reactant gases and the body).

The interface layer 418 is grown by exposing the semiconductor body 402 to the oxidant mixture which contains the oxygen and the reducing agent. The oxygen reacts with the body 402 to oxidize the body and establish the oxide interface layer 418. The reducing agent concurrently etches the oxide interface layer 418 as the layer is grown. The concurrent oxidation and reduction of the oxide interface layer slows the growth rate of the layer 418 allowing it to be grown in a controllable manner (e.g., to achieve a desired thickness and/or level of uniformity). The reducing agent can be, for example, hydrogen and/or any other suitable element, such as hydrochloric acid (HCl), for example, that, alone or in combination, counteracts the oxidation process to reduce the rate of oxide growth.

By way of example, at an ambient pressure of between about 1 mTorr to 100 Torr and at a temperature of about 850 degrees Celsius or more, when the hydrogen in the gas phase is below about 2 Torr (e.g., between about 1 and 2 Torr), the hydrogen reacts with the oxygen to form water vapor ($H_2O$), which facilitates an increase in the oxidation rate from about 35 to about 55 Angstroms/minute. As the partial pressure of hydrogen exceeds about 6 Torr, the hydrogen combines with the oxygen to a lesser and lesser degree, so that the "wet" oxidation ceases, and the excess hydrogen begins to act as an etchant to slow the rate of growth of the oxide interface layer 418. As the partial pressure of hydrogen increases (e.g., from about 6 to about 12 Torr), and consequently the amount of excess hydrogen increases, the growth rate of the oxide layer is reduced further and further (e.g., from about 55 to about 20 Angstroms/minute). While particular values for different parameters (e.g., temperature, pressure) have been discussed herein, it will be appreciated that these values may be varied to achieve different results.

The simultaneous oxidation and reduction permits the interface layer 418 to be formed under higher temperatures due to the enhanced control of growth rate. Growing the oxide interface layer 418 at higher temperatures yields higher quality oxides, which in turn facilitates production of better and more reliable resulting products. While not wishing to be tied to any particular theory, at higher temperatures atoms (e.g., of oxygen) have more energy and move around more easily, and can thus react more readily to find stable positions in forming the oxide layer. Consequently, the higher quality oxide possesses fewer dangling bonds (e.g., that are not fulfilled by oxygen) at an interface of the body 402 with the oxide interface layer 418. At lower temperatures (e.g., conventionally below about 850 degrees Celsius) more defects are created because there is less atomic mobility resulting in more "frozen-in" defects.

Figure 7:
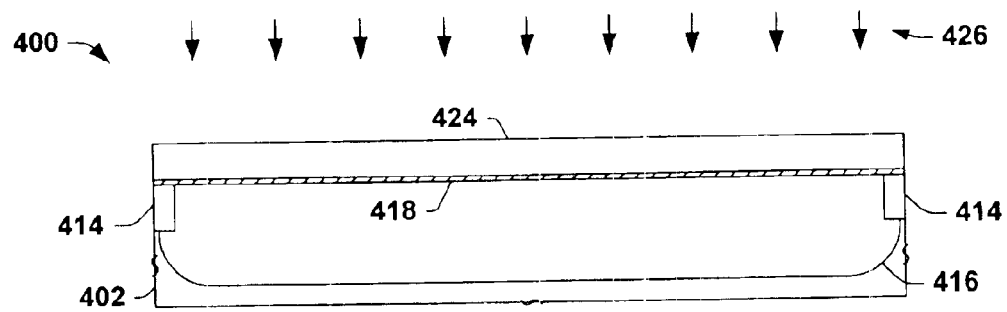

In FIG. 7, a high-k dielectric layer 424 is formed over the interface oxide layer 418 via a deposition process 426 (e.g., CVD, ALD, or sputtering). It is to be appreciated that any one or more high-k dielectric materials can be utilized, either alone or in combination, to form the layer 424. Some examples of suitable high-k dielectric materials are set forth in Table 1 below.

TABLE 1

| Dielectric Material | Approximate Relative Permittivity (k) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | about 20–about 200 |
| barium strontium oxide ($Ba_{1-x}Sr_xO_3$) | about 20–about 200 |
| $PbTiO_3$ | about 20–about 200 |
| barium titanate ($BaTiO_3$) | about 20–about 200 |
| strontium titanate $SrTiO_3$ | about 20–about 200 |
| $PbZrO_3$ | about 20–about 200 |
| PST ($PbSc_xTa_{1-x}O_3$) | 3000 |
| PZN ($PbZn_xNb_{1-x}O_3$) | about 500–about 5000 |
| PZT ($PbZr_xTi_{1-x}O_3$) | about 150–about 1000 |
| PMN ($PbMg_xNb_{1-x}O_3$) | about 500–about 5000 |

It will be appreciated that Table 1 is not an exhaustive list of high-k dielectric materials and that other high-k materials may be available. It will be further appreciated that the k-values for both standard-k and high-k materials may vary to some degree depending on the exact nature of the dielectric material. Thus, for example, differences in purity, crystallinity and stoichiometry, may give rise to variations in the exact k-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present invention, exact stoichiometry is not intended unless explicitly stated. As will be understood by those of skill in the art, such variations may occur naturally, or may be sought and controlled by selection and control of the conditions under which materials are formed.

Figure 8:
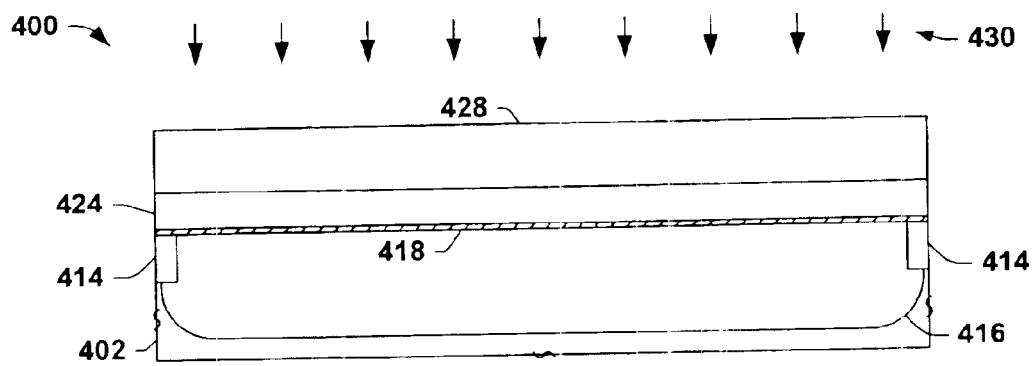
Figure 9:
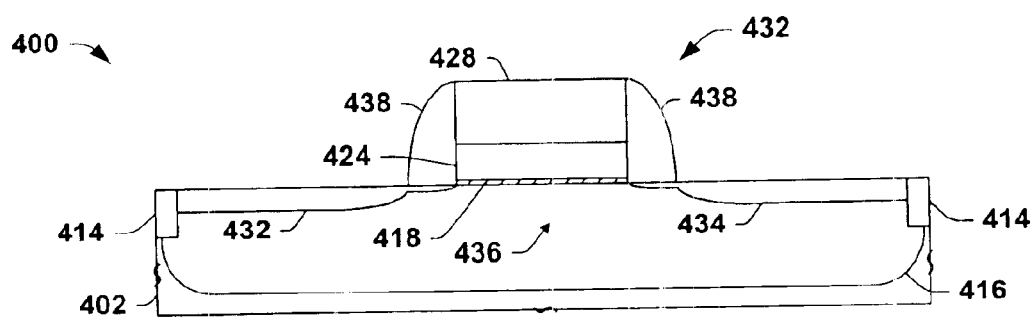

Turning to FIG. 8, a gate contact layer 428 such as polysilicon (or other conductive gate electrode, such as metals, metal nitride and metal silicides) is then deposited over the high-k material 424 via a deposition process 430. In FIG. 9, the gate contact layer 428, the high-k dielectric layer 424, and the interface oxide layer 418 are patterned to form a transistor gate structure 432. Source/drain regions 434 are doped with p-type impurities on either side of a channel region 436 in the semiconductor body 402, and sidewall spacers 438 are formed along the sides of the patterned layers 418, 424, and 428 as illustrated in FIG. 9. Thereafter, interconnect processing (not shown) is performed to interconnect the illustrated MOS type transistor and other electrical components in the device 400.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming a high quality oxide layer suitable for use as an interface oxide layer between a high-k dielectric and an underlying substrate in a semiconductor device comprising:

introducing an oxidant comprising oxygen and a reducing agent to a semiconductor body;

growing the oxide layer over the semiconductor body with the oxidant; and concurrently reducing the oxide layer with the reducing agent, where the concurrent growth and reduction facilitates growing the oxide layer at a controlled rate.

2. The method of claim 1, wherein the growth rate is controlled to be between about 20–55 Angstroms per minute at a temperature of about 850° C. or more.

3. The method of claim 1, wherein the oxide layer is grown to a thickness of about 10 Angstroms or less.

4. The method of claim 1, wherein the reducing agent comprises hydrogen.

5. The method of claim 4, wherein the oxidant further comprises at least one of nitrous oxide ($N_2O$), carbon monoxide (CO) and carbon dioxide ($CO_2$).

6. The method of claim 1, wherein the reducing agent has a partial pressure between about 6 and 12 Torr.

7. The method of claim 1, wherein the reducing agent edges the oxide layer to reduce the rate growth.

8. The method of claim 1, wherein the growth occurs under a pressure of between about 1 m Torr to 100 Torr.

9. The method of claim 1, wherein the reducing agent comprises hydrochloric acid (HCl).

10. The method of claim 1, wherein the growth occurs at a temperature from about 850 to about 1150 degrees Celsius.

11. The method of claim 1, wherein the semiconductor body comprises silicon.

12. The method of claim 11, wherein growing the oxide layer comprises growing $SiO_2$ over the semiconductor body.

13. A method of fabricating a transistor gate structure in a semiconductor device, comprising:

growing an interface oxide layer over a semiconductor body using an oxidant comprising oxygen and a reducing agent, the oxidant facilitating concurrent oxidation and reduction of the oxide such that the oxide is grown at a controlled rate;

forming a high-k dielectric layer over the interface oxide layer;

forming a gate contact layer over the high-k dielectric layer; and patterning the gate contact layer, the high-k dielectric layer, and the interface oxide layer to form a transistor gate structure.

14. The method of claim 13, wherein the growth rate is controlled to be between about 20–55 Angstroms per minute at a temperature of about 850° C. or more.

15. The method of claim 13, wherein the interface oxide layer is grown to a thickness of about 10 Angstroms or less.

16. The method of claim 13, wherein the reducing agent comprises hydrogen.

17. The method of claim 16, wherein the oxidant further comprises at least one of nitrous oxide ($N_2O$), carbon monoxide (CO) and carbon dioxide ($CO_2$).

18. The method of claim 13, wherein the reducing agent has a partial pressure of between about 6 to 12 Torr.

19. The method of claim 13, wherein the reducing agent etches the oxide to reduce the rate of growth.

20. The method of claim 13, wherein the growth occurs under a pressure of between about 1 mTorr to 100 Torr.

21. The method of claim 13, wherein the reducing agent comprises hydrochloric acid (HCl).

22. The method of claim 13, wherein the growth occurs at a temperature from about 850 to about 1150 degrees Celsius.

23. The method of claim 13, wherein the semiconductor body comprises silicon.

24. The method of claim 23, wherein growing the interface oxide layer comprises growing an $SiO_2$ interface oxide layer over the semiconductor body.

25. The method of claim 13, wherein the high-k dielectric layer comprises at least one of aluminum oxide ($Al_2O_3$), zirconium silicate, hafnium silicate, hafnium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate ($Ba_{1-x}Sr_xTiO_3$), barium strontium oxide ($Ba_{1-x}Sr_xO_3$), $PbTiO_3$, barium titanate ($BaTiO_3$), strontium titanate $SrTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$), ZrSiON, HfON, ZrON, AlON, LaON, YON and LaAlON.

26. The method of claim 13, wherein the gate contact layer comprises at least one of polysilicon, metal nitride and metal silicide.

27. The method of claim 13, wherein the high-k dielectric layer has a thickness of about 1 nanometers or more.

28. The method of claim 13, wherein the gate contact layer has a thickness of about 100 nanometers or less.

* * * * *